United States Patent

Dobuzinsky et al.

Patent Number: 5,899,724
Date of Patent: May 4, 1999

[54] METHOD FOR FABRICATING A TITANIUM RESISTOR

[75] Inventors: David Mark Dobuzinsky, Hopewell Junction, N.Y.; Stephen Gerard Fugardi, New Milford, Conn.; Erwin Hammerl, Stormville, N.Y.; Herbert Lei Ho, New Windsor, N.Y.; Samuel C. Ramac, Wappinger Falls, N.Y.; Alvin Wayne Strong, Essex Junction, Vt.

[73] Assignees: International Business Machines Corporation, Armonk, N.Y.; Siemens Aktiengesellschaft, Germany

[21] Appl. No.: 08/647,392

[22] Filed: May 9, 1996

[51] Int. Cl.[6] .................................................. H01L 21/20
[52] U.S. Cl. .......................... 438/384; 438/385; 438/643; 438/648; 438/656
[58] Field of Search ................................... 438/384, 643, 438/653, 934, 385, 648, 656

[56] References Cited

U.S. PATENT DOCUMENTS

| | | | |
|---|---|---|---|
| 4,690,728 | 9/1987 | Tsang et al. | 156/643 |
| 4,755,480 | 7/1988 | Yau et al. | 437/47 |
| 4,786,612 | 11/1988 | Yau et al. | 437/47 |
| 5,030,588 | 7/1991 | Hosaka | 437/60 |
| 5,175,114 | 12/1992 | Ono et al. | 437/1 |
| 5,254,493 | 10/1993 | Kumar | 437/60 |
| 5,441,914 | 8/1995 | Taft et al. | 437/189 |

FOREIGN PATENT DOCUMENTS 48-70896  9/1973  Japan.

*Primary Examiner*—Charles Bowers
*Assistant Examiner*—Reneé R. Berry
*Attorney, Agent, or Firm*—Schmeiser, Olsen & Watts

[57] ABSTRACT

According to the preferred embodiment of the present invention, an improved resistor and method of fabrication is provided. The method for fabricating a resistive element into an integrated circuit semiconductor device comprises the steps of: depositing a dielectric film, such as silicon nitride; depositing a titanium film upon the dielectric film; and annealing the titanium and dielectric films. This causes titanium to be diffused into the dielectric film. This creates a resistive element having a relatively high resistivity. The preferred embodiment method has the advantage of being easily integrated into conventional integrated circuit fabrication techniques.

14 Claims, 5 Drawing Sheets

METHOD FOR FABRICATING A TITANIUM RESISTOR

BACKGROUND OF THE INVENTION

1. Technical Field

This invention generally relates to semiconductor devices, and more specifically relates to fabricating resistors in semiconductor devices.

2. Background Art

The use of integrated circuits has spread to all types of products for many types of uses. These integrated circuits contain a wide variety of components, such as field-effect transistors, bipolar transistors, etc. Some of the necessary but also the more difficult and space intensive components to fabricate are resistive elements or resistors.

The types of resistors which can be fabricated in integrated circuit (I.C.) processing can be classified into three categories: (1) diffused resistors; (2) field effect resistors, and (3) thin-film resistors.

Diffused resistors are created by doping the semiconductor device with n or p type materials and annealing the semiconductor device. The resistance of the diffused resistor depends upon the length, width, depth of the diffusion and resistivity of the diffused material. The resistivity of the diffused material is dependent upon the dopant and junction profile of the dopant species after a high temperature anneal.

Field-effect resistors are transistors used in depletion-mode and modulated by the implantation that controls the threshold voltage of the transistors.

The diffused resistor and field-effect resistor each have the advantage of being easily integrated into the I. C. fabrication process. However, these types of resistors also have numerous disadvantages. Specifically, these types of resistors are usually limited in resistance and tolerance because the parameters controlling these resistances are the same parameters that must optimized for device performance. Thus, only low resistances are available with practical I.C. diffusion structures or field effect transistors. Additionally, the diffused resistors have the drawback of requiring excessive space on the I. C., a serious disadvantage as the size of I.C.s continues to shrink.

Conversely, the third category of resistors, thin film resistors, are typically resistive metal films which are deposited upon dielectric materials such silicon dioxide ($SiO_2$). These thin film resistors have the advantage of sparing critical area upon the silicon (Si) substrate. Unfortunately, these resistors are typically produced only in Back-End-Of-Line (BEOL) processing and are thus limited in application.

There are several metallic films that can be used in thin film resistors with relatively high impedance (1000–10,000 ohms/sq.). For example, thin film resistors can be created using metals such as cermets (Ni/Cr, $Cr/SiO_2$) and rhenium. Unfortunately, these resistor materials are not commonly used in standard VLSI processing, and thus are difficult and costly to implement into the fabrication process. Additionally, the required metallurgical contact to these resistors as well as to Si devices may require different materials which may be incompatible in Si device processing.

Thus, the prior art suffers from the inability to make small and easy to manufacture resistors in I.C. processing. Therefore, what is needed is improved resistors capable of offering high resistance which can be easily integrated into conventional processing methods.

DISCLOSURE OF INVENTION

According to the present invention, an improved resistor and method of fabrication is provided. The method for fabricating a resistive element into an integrated circuit semiconductor device comprises the steps of: depositing a dielectric film, such as silicon nitride; depositing a titanium film upon the dielectric film; and annealing the titanium and dielectric films. This causes titanium to be diffused into the dielectric film. This creates a resistive element having a relatively high resistivity.

It is thus an advantage of the present invention to provide a method for fabricating a resistor that creates high resistivity resistors, with materials and methods common in integrated circuit processes.

The foregoing and other advantages, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

A resistor design and fabrication method is provided that creates a high resistance, compact and easily fabricated resistive element. The preferred embodiment resistor fabrication method uses materials that are common in I.C. processing. Additionally, the preferred embodiment resistor has the advantage of a high resistivity that can be produced early in the fabrication process and does not require waiting until Back-End-of-Line (BEOL) processing. The preferred embodiment resistor can be used in a wide variety of I.C. products, i.e., SRAMS, logic elements, microprocessors.

The preferred embodiment uses a technique to fabricate high-load titanium silicon nitride (TiSiN) resistors. These resistors can have resistances of 1012–1014 ohms/sq. The materials used to create the TiSiN resistor are materials commonly used in I.C. processing, namely titanium (Ti) and silicon nitride ($Si_3N_4$), and thus are economical alternatives to more costly and complex designs.

The resistor design and fabrication method of the preferred embodiment has the additional advantage of being easily adaptable to a vertical resistor plug structure. The vertical resistor plug structure includes a lower contact and an upper contact, with a resistive material between the contacts. The resistive dimension of a vertical resistor plug, defined as the length of the conductivity path through the resistive material, is the depth of the resistive material between the two contacts. The preferred resistor design, when implemented in a vertical resistor plug structure has the advantage of having dimensions as small as a single contact, but able to increase in size to several contacts where lower resistance is desired. This structure combined with the preferred resistor design provides a high resistance, independent of other process parameters, such that the resistance can be uniquely optimized.

Figure 1:
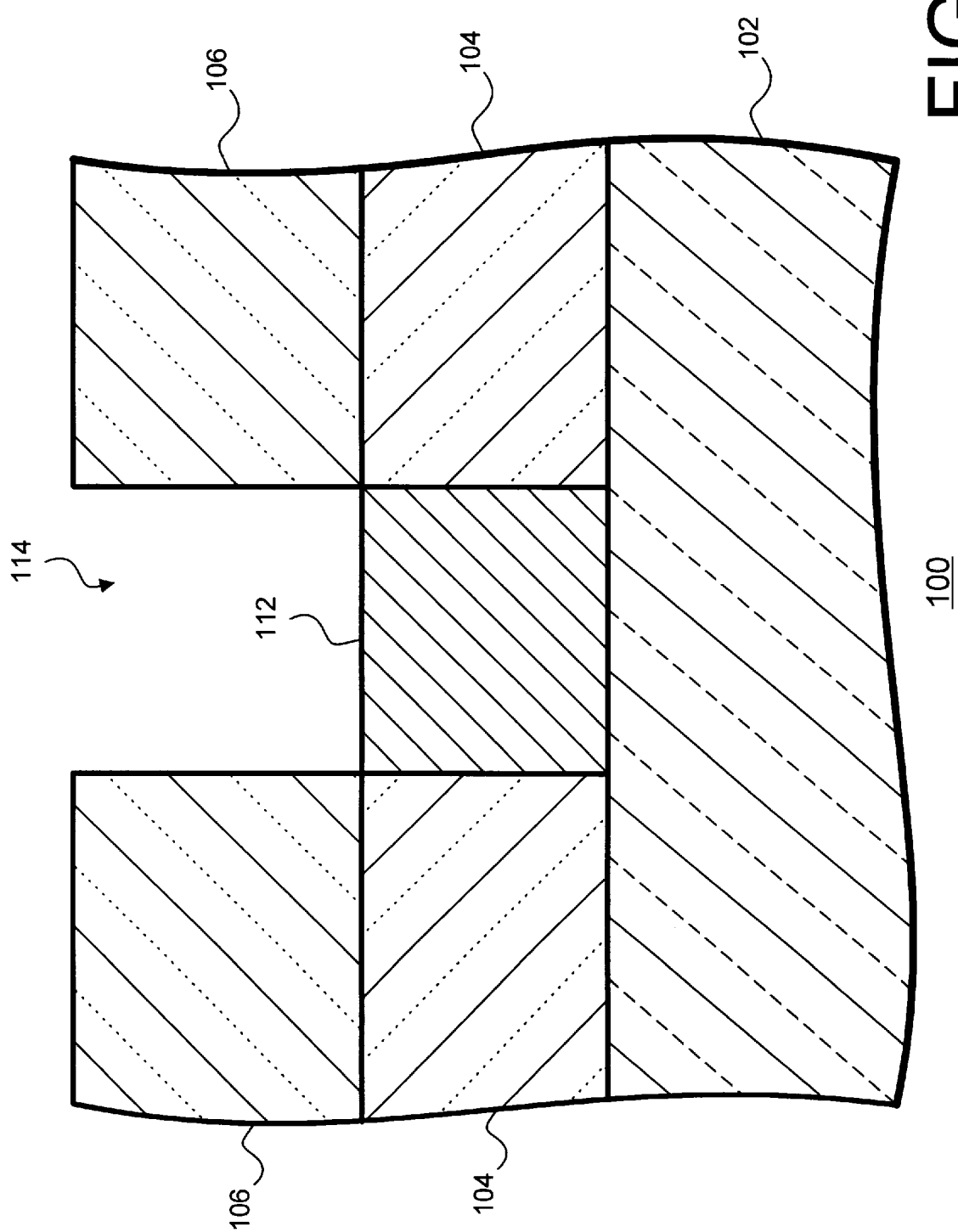
FIG. 1 is a cross-sectional side view of a semiconductor device.

Turning now to FIG. 1, FIG. 1 is a cross sectional side view of a semiconductor device 100. The semiconductor device 100 will be used to illustrate a TiSiN resistor in accordance with the preferred embodiment. In particular, a vertical resistor plug will be illustrated with semiconductor device 100. However, the fabrication method and resistor design of the preferred embodiment is not limited to the structure of a vertical resistor plug.

The semiconductor device 100 includes a substrate 102 region, oxide regions 104, 106 and a contact 112. The substrate 102 typically comprises silicon, but can suitably comprise other substrate materials. The oxide regions typically comprise a field oxide such as silicon dioxide ($SiO_2$) or tetra-ethylortho-silicate (TEOS). Oxide region 104 is first deposited on the substrate 102. The oxide 104 would then be etched and the contact 112 deposited in the etched cavity. The contact 112 is suitable metal contact, such as tungsten or aluminum, and is typically formed using a reactive ion etch. The contact 112 serves to connect the resistor element to the other elements, not shown, on semiconductor device 100.

Oxide region 106 is then be deposited. Contact 112 is then exposed by creating an open region 114 in the field oxide. This open region 114 is typically created using standard lithographic masking techniques. Of course, other suitable processes could be used to create the contact 112 and the opening 114 to the contact 112.

Figure 2:
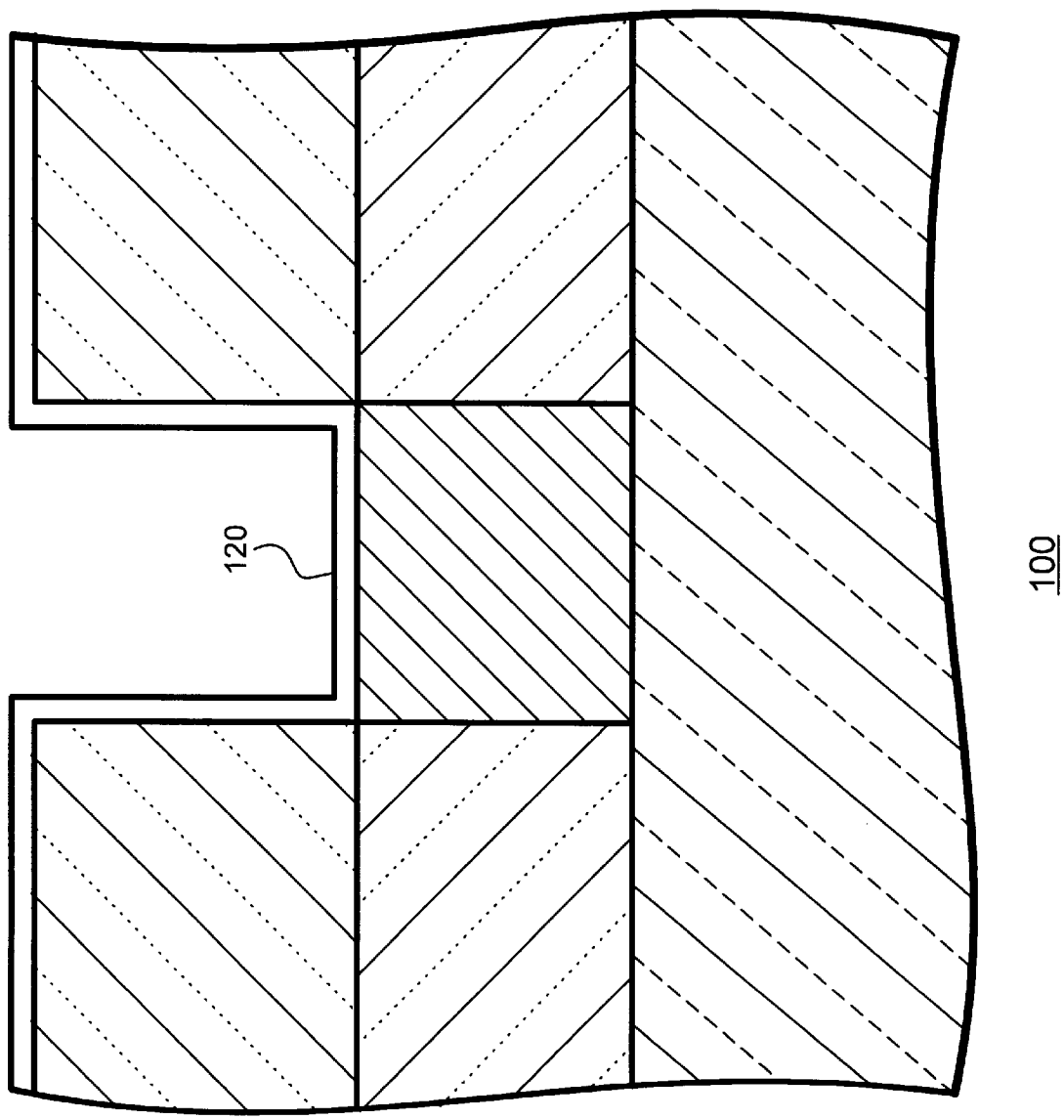
FIG. 2 is a cross-sectional side view of a semiconductor device.

Turning now to FIG. 2, FIG. 2 is a cross sectional side view of a semiconductor device 100. The first step in fabricating a TiSiN resistor in accordance with the preferred embodiment is to deposit a thin dielectric film 120 on the semiconductor device 100, specifically, contacting at least a portion of contact 12. The dielectric film 120 is preferably created using a low-pressure chemical-vapor-deposition (LPCVD) process. The dielectric film 120 preferably consists of silicon nitride ($Si_3N_4$) but suitably could comprise silicon dioxide ($SiO_2$). Preferably the film 120 is less than 8 nm thick, but suitably has a thickness of less than 120 nm. As will be explained in greater detail, the preferred embodiment has the advantage of being able to vary the resistivity of the resistor by varying the thickness of dielectric film 120.

Figure 3:
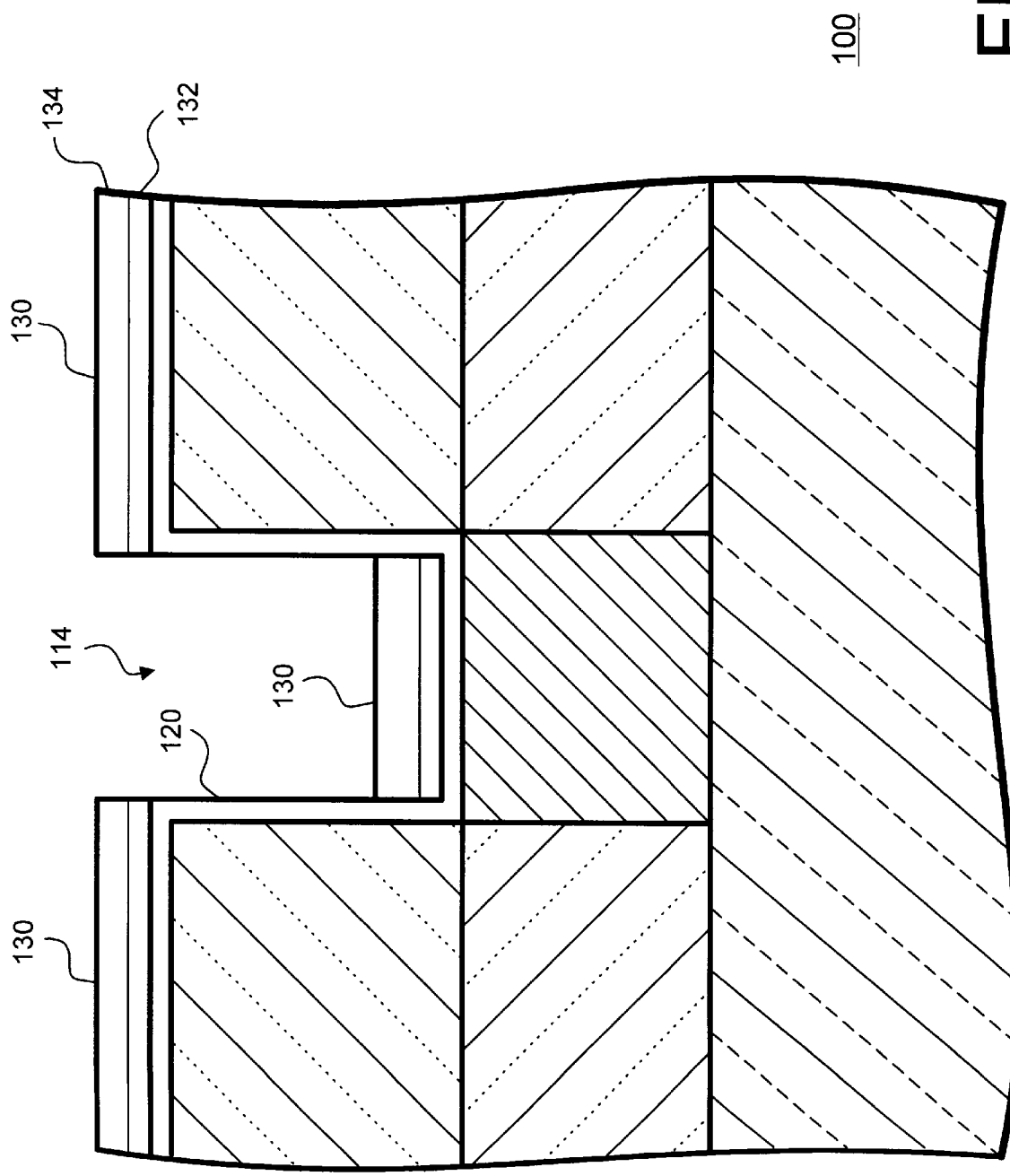
FIG. 3 is a cross-sectional side view of a semiconductor device.

Turning now to FIG. 3, FIG. 3 is a cross sectional side view of a semiconductor device 100. The next step in the preferred embodiment is to deposit a titanium layer 130 atop the dielectric film 120. The titanium layer 130 is preferably sputter-deposited using well known techniques, but other deposition methods can also be used. For example, a LPCVD process can be used, and would result in titanium layer 130 covering portions of dielectric film 120 on the sides of the opening 114 as well.

Preferably, the titanium layer 130 includes a titanium nitride (TiN) "cap," and thus comprises a Ti/TiN stack. Specifically, the bottom portion 132 of the Ti/TiN stack preferably comprises 5–40 nm of Ti, and the cap top portion 134 preferably comprises 30–70 nm TiN. The resistivity of the final resistor will depend upon the thickness of the Ti film deposited. The greater the thickness of the Ti film, the more Ti which will be diffused into the resistor, resulting in lower resistance. Additionally, to fabricate a resistor with more resistance, a thicker dielectric film 120 is required, and likewise a thicker film of Ti.

The use of the TiN cap has the advantage of blocking underlying Ti from reacting with the nitrogen of the annealing ambient. Thus, more of the underlying Ti is diffused into the dielectric film 120. In an alternative embodiment, the titanium layer comprises a single layer of Ti, with a thickness between 5 and 40 mn.

Figure 4:
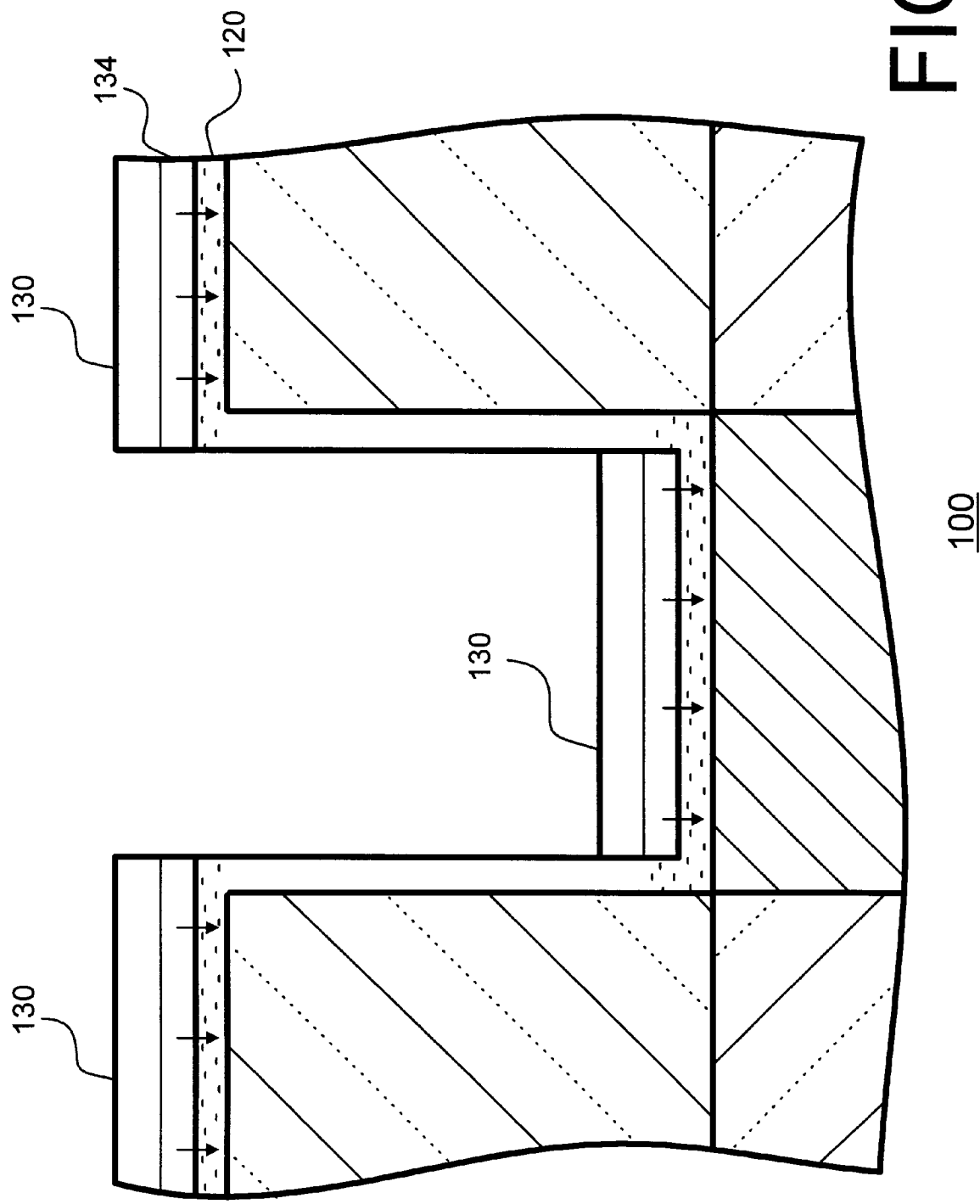
FIG. 4 is a cross-sectional side view of a semiconductor device.

Turning now to FIG. 4, FIG. 4 is a cross-sectional side view of a semiconductor device 100. After titanium layer 130 has been deposited, the next step is for semiconductor device 100 to be annealed in an inert ambient such as nitrogen or forming gas (90% $N_2$, 10% $H_2$). The anneal causes Ti from titanium layer 130 to diffuse into the dielectric layer 120 as illustrated. This diffusion creates a titanium diffused dielectric film having a limited conductivity suitable for a resistor.

The annealing is suitably done for 10–120 minutes at 450–750° C., and more suitably done for 20 to 40 minutes at 525–625° C., with a preferred annealing for 30 minutes at 600° C. The resistivity of the resulting resistor is dependent upon the time and temperature of the annealing process. The actual temperature used for the annealing would therefore vary according to the desired resistivity. Additionally, it may be desired to vary the annealing time and temperature depending upon the part of the fabrication process in which the resistor is being created.

For a resistor to be created in the preferred embodiment, the semiconductor device should be annealed such that titanium is diffused into the dielectric layer 120. When the semiconductor device 100 is annealed at proper temperatures and for proper time, only a small percentage of Ti enters the $Si_3N_4$, and will remain in that film. The longer the annealing, the more Ti will enter, resulting in higher conductivity of the resulting film. However, if it is over-annealed, the titanium reacts with the $Si_3N_4$ and forms TiSi and TiN, causing the nitride film to break up, and a workable resistor will not be formed.

Figure 5:
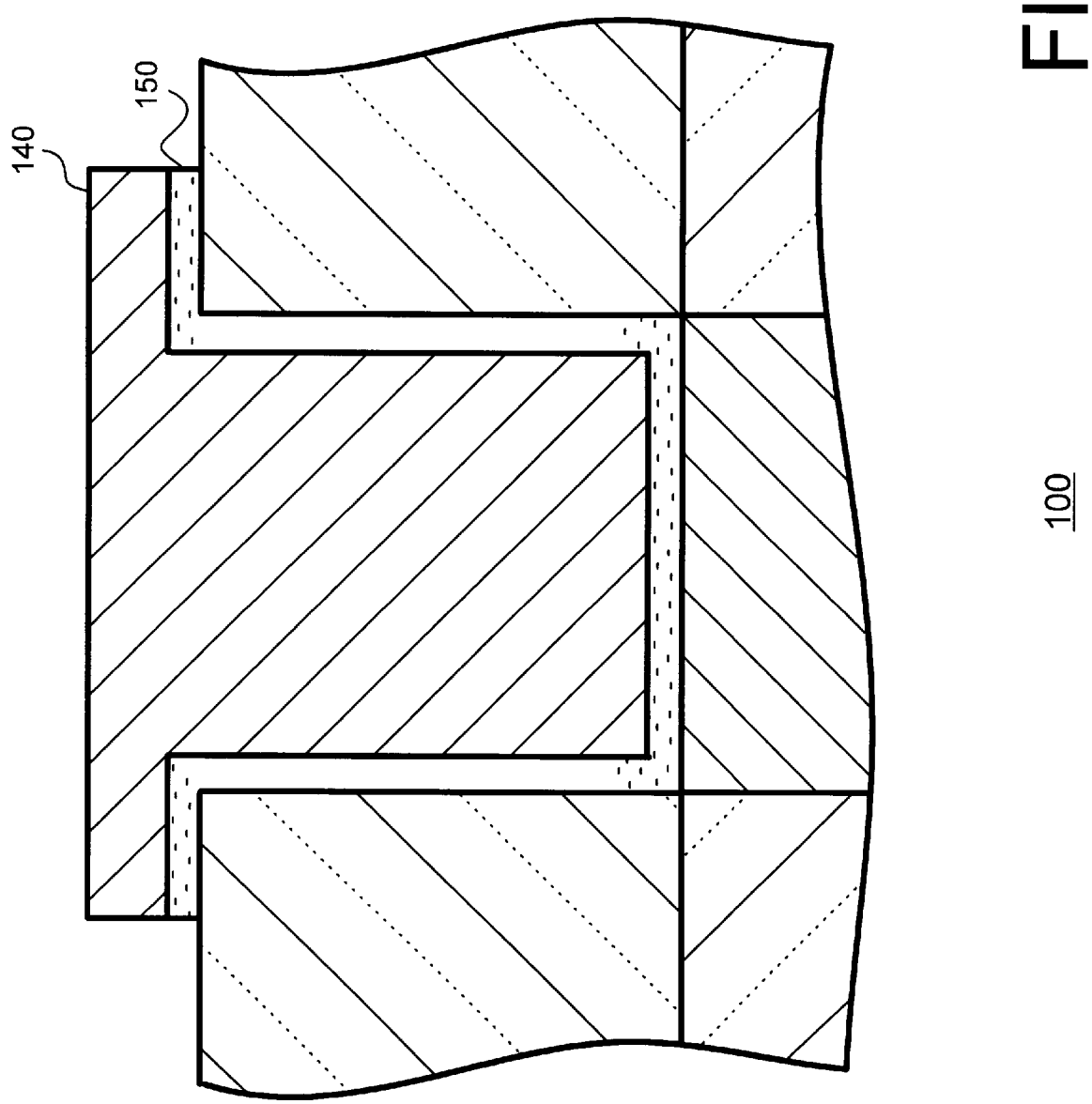
FIG. 5 is a cross-sectional side view of a semiconductor device containing a diffused titanium resistor.

Turning now to FIG. 5, FIG. 5 is a cross sectional view of a semiconductor device 100. After annealing, the remaining portions of titanium layer 130 are removed. This is preferably done by a selective metal etch but other suitable methods can be used.

After the titanium has been removed, an upper contact 140 is deposited. The upper contact preferably comprises aluminum and is preferably deposited during the BEOL final wiring. Of course, the upper contact can comprise other suitable materials and can be created at any time in the fabrication process. Then, the excess portions of contact material are removed along with excess portion of Ti diffused $Si_3N_4$. This completes the fabrication of the resistor.

In the preferred and illustrated embodiment, the created resistors comprises a vertical resistor plug. Namely, the resistive element 150 comprises Ti diffused film of $Si_3N_4$ between a lower and upper conduct. The resistance of a vertical resistor plug will depend upon the amount of titanium annealed into the dielectric film, and the area and depth of the resulting resistive element 150. Again, with a vertical resistor plug structure, the depth of the resistive element 150 comprises the resistive dimension. The resistivity of the resistor can be increased by increasing the resistive dimension, or by decreasing the area of the resistive film.

The preferred embodiment resistor has numerous advantages and it is expected to find particular application in those circuits which require high-value bleed resistors such as Static Random Access Memory (SRAM) cells.

The method of the preferred embodiment has been tested and proved successful. As an example of a TiSiN resistor in accordance with the preferred embodiment, TiSiN resistors were created by depositing 5 nm of low-pressure chemicalvapor-deposited (LPCVD) $Si_3N_4$ and then sputter-depositing a film stack of 10 nm Ti and 40 nm TiN. After a low-temperature forming gas anneal, the residual Ti or Ti/TiN stack was removed in a selective metal etch for 9 minutes.

Resistors created using this preferred method have been measured for the resistivity of the films created. When the annealing temperature was 550° C., the resistivity was calculated to be approximately $10^7$ ohms-cm. When annealed at 600° C., the resistivity was approximately $10^6$ ohms-cm.

An analysis of the created resistors using Auger, Rutherford Backscattering Spectra (RBS) and Secondary Ion Mass Spectroscopy (SIMS) found that the resulting resistive film comprises approximately 4 to 7% by weight Ti, that amount having been diffused into the $Si_3N_4$ film by annealing for 30 minutes at 550° C. in a forming gas ambient. Further SIMS analysis shows that both Si-N and Ti-N signals are evident within the $Si_3N_4$ film. This suggests that Ti tends to bond with N within the $Si_3N_4$ (i.e., by breaking Si-N bonds), thereby leaving Si unbonded. However, from a second SIMS analysis, a Si-O signal was detected within the resistive film, suggesting that the Si immediately bonds to any oxygen which may be present in the Ti/TiN or $Si_3N_4$ films.

Further analysis using High Resolution Transmission Electron Microscopy (HRTEM) shows that the $Si_3N_4$ film remains intact and that the Ti does not appear to diffuse through the film and into the Si substrate. Of course, the stoichiometry of the TiSiN resistor is dependent upon the annealing conditions—higher annealing will tend to allow more Ti into the $Si_3N_4$ and should increase the conductivity of the $Si_3N_4$ film.

There are a number of advantages in creating a TiSiN resistor in terms of processing and layout. Because the resistivity of the film is very high, long and narrow lines of the material are not required, thereby saving chip space. In addition, temperatures used to create the TiSiN are low enough such that the resistor can be processed in the BEOL, at practically any metal wiring process. Indeed, the TiSiN resistor is ideally suited as a vertical resistor plug between contacts.

While the invention has been particularly shown and described with reference to a preferred exemplary embodiment thereof, it will be understood by those skilled in the art that various changes in form and details may be made therein without departing from the spirit and scope of the invention.

We claim:

1. A method for fabricating a resistive element into an integrated circuit semiconductor device, the method comprising the steps of:
   a) depositing a nitride dielectric film;
   b) depositing a titanium including film upon said nitride dielectric film; and
   c) annealing said titanium including film and said nitride dielectric film such that titanium is diffused into said nitride dielectric film.

2. The method of claim 1 wherein said nitride dielectric film comprises $Si_3N_4$.

3. The method of claim 1 wherein said nitride dielectric film has a resistive dimension of less than 8 nanometers.

4. The method of claim 1 wherein said nitride dielectric film has a resistive dimension of less than 120 nanometers.

5. The method of claim 1 wherein said titanium including film has a thickness of 5 to 40 nm.

6. The method of claim 1 wherein said titanium including film additionally includes nitrogen.

7. The method of claim 1 wherein said titanium including film comprises a titanium portion and a titanium nitride cap portion.

8. The method of claim 1 wherein said titanium portion has a thickness between 5 and 40 nm, and wherein said titanium nitrogen cap portion has a thickness between 30 and 70 nm.

9. The method of claim 1 wherein said step of annealing comprises annealing at a temperature less than 750° C. and greater than 450° C.

10. The method of claim 1 wherein said step of annealing comprises annealing for between 10 and 120 minutes.

11. The method of claim 1 wherein said step of annealing comprises annealing at a temperature between 525° C. and 625° C. for between 20 and 40 minutes.

12. The method of claim 1 further comprising the step of removing excess of said titanium including film after said step of annealing.

13. The method of claim 1 wherein said step of depositing a nitride dielectric film comprises depositing a nitride dielectric film atop a contact and further comprising the step of depositing a second contact above said nitride dielectric film, creating a vertical resistor.

14. A method for fabricating a resistive element into an integrated circuit semiconductor device, the method comprising the steps of:
   a) forming a first contact;
   b) depositing a silicon nitride film on said first contact, said silicon nitride film having a first side contacting said first contact and an exposed second side and wherein the dimension between said first and second sides defines a resistive dimension, said resistive dimension less than 120 nm;
   c) depositing a titanium film upon said exposed second side of said silicon nitride film, said titanium film having a thickness between 5 and 40 nm;
   d) depositing a titanium nitride cap upon said titanium film, said titanium nitrogen cap having a thickness of 30–70 nm;
   e) annealing said integrated circuit such that titanium is diffused from said titanium film into said dielectric film, said annealing being for 20 to 40 minutes at a temperature between 525° C. and 625° C.;
   f) removing said titanium film and said titanium nitride cap; and
   g) forming a second contact, said second contact contacting said second side of said silicon nitride film.

* * * * *